(12) United States Patent
Lin

(10) Patent No.: US 11,044,956 B2
(45) Date of Patent: Jun. 29, 2021

(54) TEMPERATURE CONTROLLABLE TEXTILE AND WEARABLE ASSEMBLY THEREOF

(71) Applicant: INTELLIGENCE TEXTILE TECHNOLOGY CO., LTD., Taipei (TW)

(72) Inventor: Chen-Hsiang Lin, Taipei (TW)

(73) Assignee: INTELLIGENCE TEXTILE TECHNOLOGY CO., LTD., Taipei (TW)

( * ) Notice: Subject to any disclaimer, the term of this patent is extended or adjusted under 35 U.S.C. 154(b) by 478 days.

(21) Appl. No.: 16/149,786

(22) Filed: Oct. 2, 2018

(65) Prior Publication Data

US 2019/0328055 A1 Oct. 31, 2019

(30) Foreign Application Priority Data

Apr. 27, 2018 (TW) .................................. 10711458

(51) Int. Cl.

| F25B 21/02 | (2006.01) |
|---|---|
| H01L 35/00 | (2006.01) |
| A41D 13/005 | (2006.01) |
| A41D 1/00 | (2018.01) |
| B32B 5/02 | (2006.01) |

(Continued)

(52) U.S. Cl.
CPC ......... *A41D 13/0051* (2013.01); *A41D 1/002* (2013.01); *A41D 13/0053* (2013.01); *B32B 5/024* (2013.01); *B32B 5/26* (2013.01); *D02G 3/38* (2013.01); *D02G 3/441* (2013.01); *A41D 2400/12* (2013.01); *B32B 2250/20* (2013.01); *B32B 2262/103* (2013.01); *B32B 2307/202* (2013.01); *B32B 2307/30* (2013.01); *B32B 2437/00* (2013.01); *D10B 2101/20* (2013.01);
(Continued)

(58) Field of Classification Search
CPC ...... F25B 21/02; F25B 2321/02; H01L 35/00; H01L 35/02; H01L 35/28; H01L 35/30; H01L 35/32; A41D 1/002; A41D 13/0053; B32B 5/024; B32B 5/26; D02G 3/38

See application file for complete search history.

(56) References Cited

U.S. PATENT DOCUMENTS

| 8,383,926 B2* | 2/2013 | Plissonnier .............. D04B 1/14 |
| | | 136/224 |
| 2018/0014585 A1* | 1/2018 | Polonio .................. A41D 27/00 |

(Continued)

*Primary Examiner* — Frantz F Jules
*Assistant Examiner* — Erik Mendoza-Wilkenfeld
(74) *Attorney, Agent, or Firm* — Schmeiser, Olsen & Watts, LLP

(57) ABSTRACT

A temperature controllable textile illustrated by the present disclosure has a first conductive cloth and a second conductive cloth. The first conductive cloth has a first metal while the second conductive cloth has a second metal different from the first metal. The first conductive cloth and the second conductive cloth have a thickness. A side surface of the first conductive cloth is in contact with a side surface of the second conductive cloth, and the first conductive cloth electrically connects to the second conductive cloth, to form two junction portions. When a negative end and a positive end of a direct current power electrically connects respectively with a top surface and a bottom surface of the first conductive cloth, the two junction portions form a cooling end and a heating end, respectively.

18 Claims, 7 Drawing Sheets

(51) Int. Cl.
  *B32B 5/26* (2006.01)
  *D02G 3/38* (2006.01)
  *D02G 3/44* (2006.01)

(52) U.S. Cl.
  CPC ...... *D10B 2401/16* (2013.01); *D10B 2501/04* (2013.01); *D10B 2501/043* (2013.01)

(56) References Cited

U.S. PATENT DOCUMENTS

| | | | |
|---|---|---|---|
| 2019/0035997 A1* | 1/2019 | Savoy | H01L 35/10 |
| 2019/0099980 A1* | 4/2019 | Takamatsu | B32B 5/024 |
| 2019/0104776 A1* | 4/2019 | Luoma | A61B 5/4836 |
| 2019/0277544 A1* | 9/2019 | Lakshmanan | D02G 3/404 |

* cited by examiner

TEMPERATURE CONTROLLABLE TEXTILE AND WEARABLE ASSEMBLY THEREOF

CROSS-REFERENCE TO RELATED APPLICATION

This non-provisional application claims priority under 35 U.S.C. § 119(a) on Patent Application No(s). 107114589 filed in Taiwan, R.O.C. on Apr. 27, 2018, the entire contents of which are hereby incorporated by reference.

FIELD OF THE INVENTION

The present disclosure relates to a textile, in particular, to a temperature controllable textile which is dedicated to cooling, and to a wearable assembly having the temperature controllable textile.

BACKGROUND OF THE INVENTION

As the technology advances, many enterprises try to incorporate electronic components into clothes to form smart clothes. The smart clothes not only measure physiological signals of wearers (i.e. users), but also heat the wearers. Most of the smart clothes are formed from chips, yarns, electric wires (such as enameled wires) and resistors. The electric wires are embedded or weaved in textiles formed by weaving the yarns, and the electric wires are electrically connected to the resistors and the chips. The electric wires can further connect to external power supply to supply power to the resistors and the chips. The chips each have a controller and a sensor for measuring the physiological signal. When the resistors receive the electricity, the received electricity is converted to the thermal energy, so as to heat the smart clothes. Thus, by heating the smart clothes, the smart clothes prevent the wearers in a cold environment from catching cold or feeling cold.

Specific materials are required to achieve cooling indirectly in a hot environment. However, the specific materials are not used in forming the textiles of the smart clothes. As a result, the conventional smart clothes are seldom capable of cooling.

There are several conventional cooling techniques. For example, air compressors compress air to decrease air temperature, thereby achieving cooling. However, air compressors are too bulky to be integrated into the textiles or the smart clothes. Another cooling technique is based on Peltier effect and described below.

When a current passes an interface between two different conductors, the interface absorbs heat from the outside, or releases heat to the outside, and this is known as "Peltier effect". Referring to FIG. 1A and FIG. 1B, FIG. 1A is schematic diagram showing a cooling device operating by Peltier effect, and FIG. 1B is an equivalent circuit diagram of the cooling device of FIG. 1A. The cooling device 1 comprises two metals 11, 12 having different materials, respectively. The metals 11, 12 are in contact with each other and electrically connected to each other. A positive end and a negative end of a direct current power $V_{DC}$ electrically connect to two opposite sides of the metal 11, respectively.

Since the materials of the metals 11, 12 are not identical to each other, and a closed loop is formed via the direct current power $V_{DC}$, Peltier effect occurs, which causes two junction portions JN1 and JN2 of the metals 11, 12 (i.e. two side interfaces of the metals 11, 12) to induce a temperature deviation. Thus, the junction portions JN1 and JN2 absorb and release heat respectively. Alternatively, the junction portions JN1 and JN2 release and absorb heat respectively. It is worth noting that whether the junction portions JN1 and JN2 absorb and release heat, respectively, or release and absorb heat, depends on Seebeck coefficients of the metals 11, 12. Thus, one of the junction portions JN1 and JN2 acts as a cooling end, and the other one of the junction portions JN1 and JN2 acts as a heating end.

Since the above cooling devices lack water washable and anti-tear characteristics and are simply applied to rigid devices, they cannot act as temperature controllable textiles of the smart clothes. Further, if the above cooling devices are directly disposed in the smart clothes but no consideration is given as to whether the above cooling devices have the water washable and anti-tear characteristics, the formed smart clothes may be perceived as a foreign body by the wearers to the detriment of user experiences.

SUMMARY OF THE INVENTION

To achieve an objective of an embodiment of the present disclosure, the present disclosure provides a temperature controllable textile having both of a cooling end and a heating end, so as to cool or heat a living body (such as, a human being, an animal and a plant) or an object, through the cooling end or the heating end.

According to at least one embodiment of the present disclosure, the present disclosure provides a temperature controllable textile comprising two first conductive cloths and a second conductive cloth. The two first conductive cloths each have a first metal. The second conductive cloth having a second metal not identical to the first metal is disposed between the two first conductive cloths. The second conductive cloth is in contact with and electrically connected to the two first conductive cloths, to form two junction portions. When a negative end and a positive end of a direct current power electrically connect to the two first conductive cloths, respectively, the two junction portions form a cooling end and a heating end, respectively.

Optionally, a top surface and a bottom surface of the second conductive cloth are in contact with a bottom surface of one of the first conductive cloths and a top surface of the other first conductive cloth, respectively.

Optionally, the temperature controllable textile further comprises two insulated heat-conductive films disposed on a top surface of one of the first conductive cloths and under a bottom surface of the other first conductive cloth, respectively, wherein the top surface of one of the first conductive cloths and the bottom surface of the other first conductive cloth are not in contact with the second conductive cloth.

Optionally, each of the two first conductive cloths and the second conductive cloth comprises a plurality of signaling yarns, and the signaling yarns each comprise a staple fiber and a sheet conductor. The staple fiber has a strength of 26 to 40 strands and acts as a supporting material. The sheet conductor enlaces a surrounding surface of the staple fiber by taking a spiral course. A material of the sheet conductor included in the signaling yarn of each the first conductive cloth is the first metal, and a material of the sheet conductor included in the signaling yarn of the second conductive cloth is the second metal.

Optionally, two sides of the second conductive cloth are in contact with a side of one of the first conductive cloths and a side of the other first conductive cloth, respectively.

Optionally, the two first conductive cloths and the second conductive cloth are an integrally formed cloth, wherein the integrally formed cloth comprises a plurality of composite signaling yarns, and the composite signaling yarn comprises a staple fiber and a composite sheet conductor. The staple fiber having a strength of 26 to 40 strands acts as a supporting material. The composite sheet conductor enlaces a surrounding surface of the staple fiber by taking a spiral course. The composite sheet conductor is formed by connecting a sheet conductor of the first metal, a sheet conductor of the second metal and another sheet conductor of the first metal in sequence.

According to at least one embodiment of the present disclosure, the present disclosure provides a temperature controllable textile comprising a first conductive cloth and a second conductive cloth. The first conductive cloth has a first metal. The second conductive cloth has a second metal not identical to the first metal. Both of the first conductive cloth and the second conductive cloth have a thickness. A side surface of the first conductive cloth is in contact with a side surface of the second conductive cloth. The first conductive cloth electrically connects to the second conductive cloth, to form two junction portions. When a negative end and a positive end of a direct current power electrically connect to a top surface and a bottom surface of the first conductive cloth, respectively, the two junction portions form a cooling end and a heating end, respectively.

Optionally, the temperature controllable textile according further comprises two insulated heat-conductive films disposed on top surfaces of the first and second conductive cloths and under bottom surface of the first and second conductive cloths, respectively.

Optionally, the first conductive cloth and the second conductive cloth are an integrally formed cloth, wherein the integrally formed cloth comprises a plurality of composite signaling yarns, and the composite signaling yarn comprises a staple fiber and a composite sheet conductor. The staple fiber having a strength of 26 to 40 strands acts as a supporting material. The composite sheet conductor enlaces a surrounding surface of the staple fiber by taking a spiral course. The composite sheet conductor is formed by connecting a sheet conductor of the first metal and a sheet conductor of the second metal in sequence.

According to at least one embodiment of the present disclosure, the present disclosure provides wearable assembly comprising any one of the above temperature controllable textiles.

To sum up, the present disclosure provides a temperature controllable textile having a cooling end and a heating end, and the temperature controllable textile is able to increase or decrease the temperature of the living body or the object, in the different environments. In addition, the temperature controllable textile is not perceived as a foreign body by the wearer, and thus wearing the wearable assembly formed from the temperature controllable textile is a satisfactory wearing experience for the wearer.

BRIEF DESCRIPTION OF THE DRAWINGS

In order that the present disclosure may be better understood and readily carried into effect, certain embodiments of the present disclosure will now be described with reference to the accompanying drawings, wherein.

DETAILED DESCRIPTION OF THE PREFERRED EMBODIMENTS

Figure 1A:
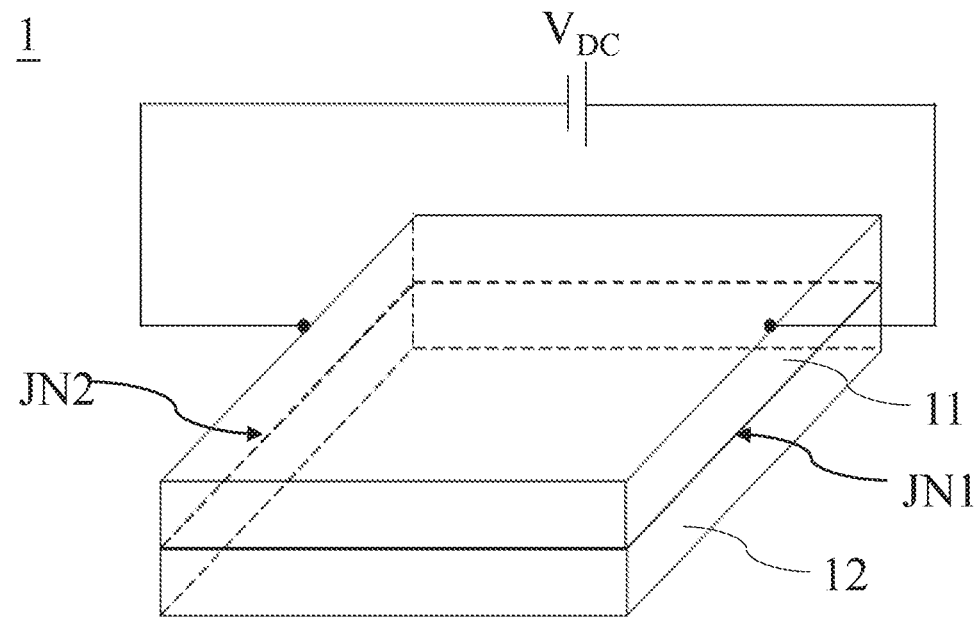
FIG. 1A (Related Art) is schematic diagram showing a cooling device utilizing Peltier effect.
Figure 1B:
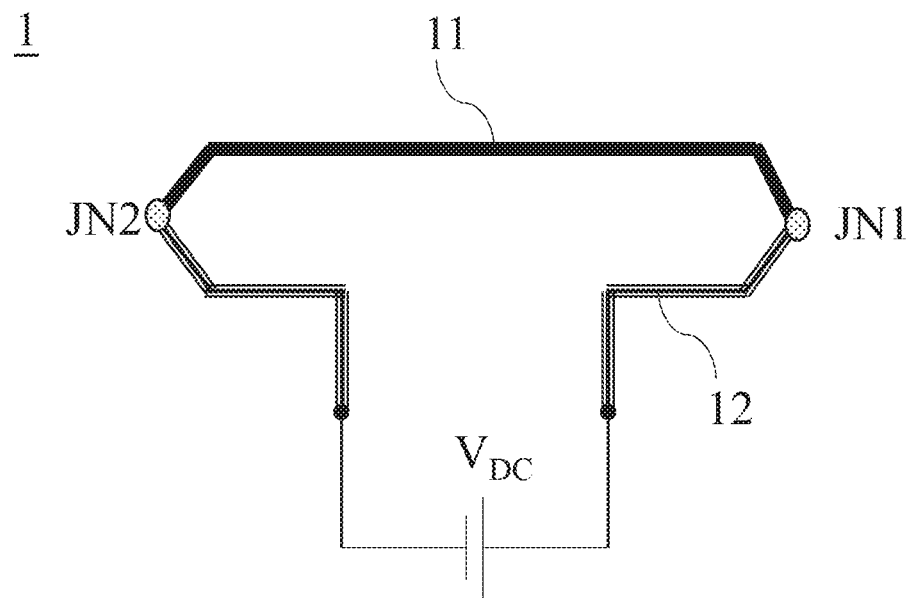
FIG. 1B (Related Art) is an equivalent circuit diagram of the cooling device of FIG. 1A.

To make it easier for the examiner to understand the objects, characteristics and effects of this present disclosure, embodiments together with the attached drawings for the detailed description of the present disclosure are provided.

The present disclosure provides a temperature controllable textile which has the water washable and anti-tear characteristics and can be stitched to other textile, so as to form a part of a wearable assembly (such as, smart clothes, smart shoes, smart pant, wristbands or kneecaps). Furthermore, the temperature controllable textile is not only used to form the wearable assembly, but also dedicated for controlling a temperature of a crop, an electronic equipment, a farm animal or other object or living body.

In the embodiment of the present disclosure, the temperature controllable textile has at least one first conductive cloth and a second conductive cloth, wherein the at least one first conductive cloth has a first metal, the second conductive cloth has a second metal, and the first metal is not identical to the second metal (i.e. having different Seebeck coefficients.) The at least one first conductive cloth and the second conductive cloth have two junction portions therebetween. A positive end and a negative end of a direct current power electrically connect to the at least one first conductive cloth. The positive end and the negative end of the direct current power correspond to the two junction portions such that the two junction portions act as a cooling end and a heating end, respectively.

In an embodiment, the at least one first conductive cloth is in the number of two. One of the two first conductive cloths is disposed on and in contact with a top surface of the second conductive cloth while the other one of the two first conductive cloth is disposed under and in contact with a bottom surface of the second conductive cloth. The two first conductive cloths electrically connect to the second conductive cloth. When the positive end and the negative end of the direct current power electrically connect to the two first conductive cloths respectively, the top surface and the bottom surface of second conductive cloth act as the two junction portions, respectively, which in turn act as a cooling end and a heating end respectively (or the heating end and the cooling end), such that the two junction portions absorb and release heat respectively (or release and absorb heat.) Each of the two first conductive cloths and the second conductive cloth in the embodiment can be formed by weaving signaling yarns formed of different metals, respectively.

In another embodiment, the at least one first conductive cloth is in the number of two. Two sides of the two first conductive cloth are disposed on and in contact with the two opposite sides of the second conductive cloth, respectively. The two first conductive cloth electrically connect to the second conductive cloth. When the positive end and the negative end of the direct current power electrically connect to the two first conductive cloths, respectively, the two opposite sides of the second conductive cloth act as the two junction portions acting as a cooling end and a heating end, respectively (or the heating end and the cooling end), such that the two junction portions absorb and release heat (or release and absorb heat), respectively. Each of the two first conductive cloths and the second conductive cloth in the embodiment can be formed by weaving the signaling yarns formed of different metals, respectively. Alternatively, the two first conductive cloths and the second conductive cloth are an integrally formed cloth, and the internally formed cloth is formed by weaving composite signaling yarns, wherein the composite signaling yarns each have different metals.

In another embodiment, the at least one first conductive cloth is in the number of one. A side surface of the first conductive cloth is in contact with a side surface of the second conductive cloth. The first conductive cloth electrically connects to the second conductive cloth. The first conductive cloth and the second conductive cloth have a thickness, for example, larger than 1 millimeter. When the positive end and the negative end of the direct current power electrically connect to a top surface and a bottom surface of the first conductive cloth respectively, an upper portion and a lower portion of the side surface of the first conductive cloth (the second conductive cloth) act as the two junction portions respectively. The two junction portions act as a cooling end and a heating end (or the heating end and the cooling end), respectively, such that the two junction portions absorb and release heat (or release and absorb heat) respectively. The first conductive cloth and the second conductive cloth in the embodiment can be formed by weaving the signaling yarns formed of different metals, respectively. Alternatively, the first conductive cloth and the second conductive cloth are the integrally formed cloth, and the integrally formed cloth is formed by weaving the composite signaling yarns, wherein the composite signaling yarns each have different metals.

Next, implementation details of the temperature controllable textile can be illustrated accompanying with the drawings. However, it is worth noting that the following embodiments are not intended to limit the present disclosure, and the drawings are schematic. Therefore, dimensions of the components and materials of the components are not intended to limit the present disclosure.

Figure 2:
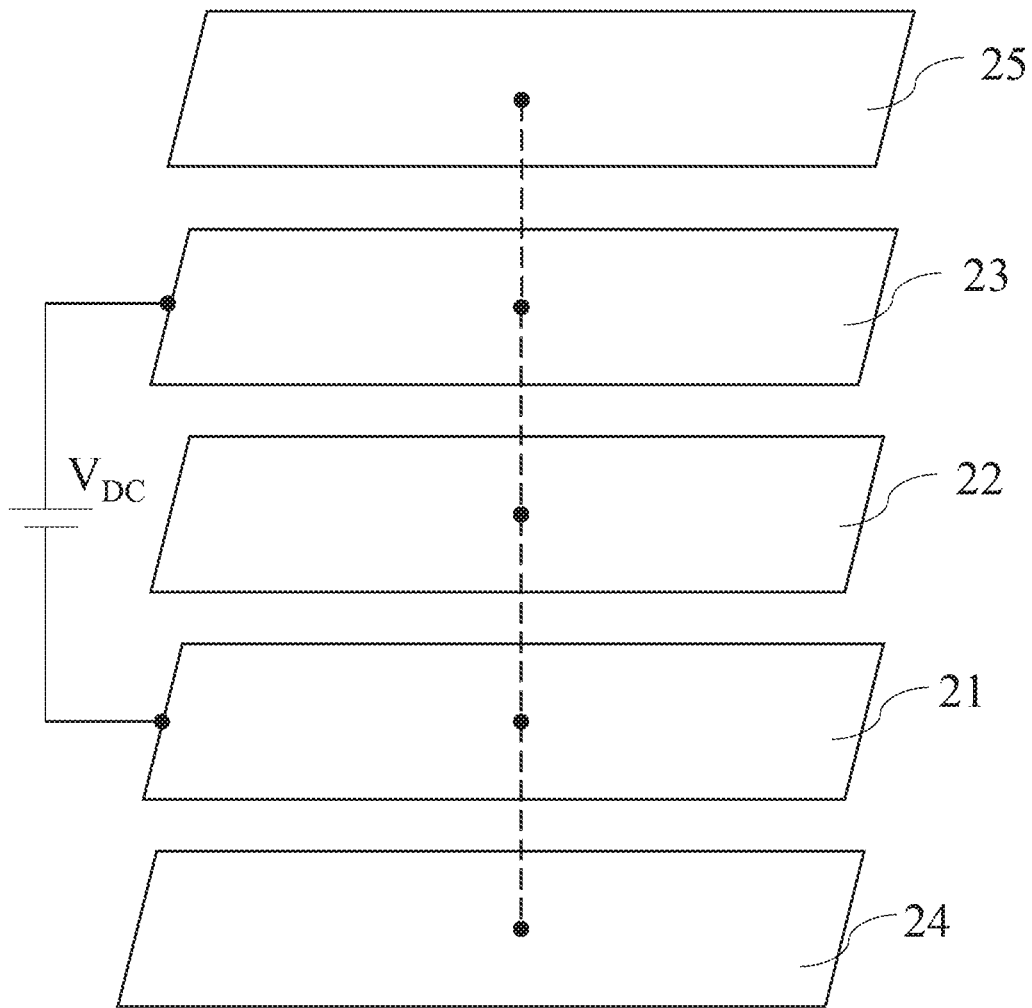
FIG. 2 is an explosive diagram of a temperature controllable textile according to an embodiment of the present disclosure.

Referring to FIG. 2, FIG. 2 is an explosive diagram of a temperature controllable textile according to an embodiment of the present disclosure. The temperature controllable textile 2 comprises two first conductive cloths 21, 23, a second conductive cloth 22 and two insulated heat-conductive films 24, 25. In the embodiment, a top surface of the first conductive cloth 21 is in contact with the bottom surface of the second conductive cloth 22, and the first conductive cloth 21 electrically connects to the second conductive cloth 22. A bottom surface of the first conductive cloth 23 is in contact with a top surface of the second conductive cloth 22, and the first conductive cloth 23 electrically connects to the second conductive cloth 22. The insulated heat-conductive film 24 is disposed under a bottom surface of the first conductive cloth 21 while the insulated heat-conductive film 24 is disposed on a top surface of the first conductive cloth 22.

The first conductive cloths 21, 23 has the same metal, and the second conductive cloth 22 has a metal different from that of the first conductive cloths 21, 23. In other words, Seebeck coefficient of the first conductive cloths 21, 23 is different from that of the second conductive cloth 22. In addition, the first conductive cloths 21, 23, the second conductive cloth 22 and the insulated heat-conductive films 24, 25 can form the temperature controllable textile 2 by adhesion, stitching or the like. The temperature controllable textile 2 can further be adhered, stitched or connected to other objects or textiles.

When a positive end and a negative end of a direct current power $V_{DC}$ electrically connect to the first conductive cloths 21, 23 respectively, Peltier effect occurs, and thus the two junction portions formed between the first conductive clothes 21, 23 and the second conductive cloth 22 act as a cooling end and a heating end (or the heating end and the cooling end) respectively. In the embodiment, the two junction portions are the top surface of the first conductive cloth 21 and the bottom surface of the first conductive cloth 23 (or the top surface and the bottom surface of the second conductive cloth 22) respectively, and thus the first conductive clothes 21, 23 in whole can be a heat absorbing interface and a heat releasing interface, or the heat releasing interface and the heat absorbing interface, respectively. It is worth noting that whether the two junction portions act as the cooling end and the heating end (or the heating end and the cooling end), respectively, depends on Seebeck coefficients of the first conductive cloths 21, 23 and the second conductive cloths 22, and/or the polarity of the direct current power $V_{DC}$.

In the embodiment, the two insulated heat-conductive films 24, 25 may be non-essential components. However, when the temperature controllable textile 3 is applied to contact the living body and the large temperature deviation between the cooling end and the heating end is required, the larger current of the direct current power $V_{DC}$ should be large. Therefore, preferably, the insulated heat-conductive films 24, 25 should be included in the temperature controllable textile 3 to prevent the living body from being hurt due to the large current.

In the embodiment, the first conductive cloths 21, 23 and the second conductive cloth 22 are formed by weaving signaling yarns formed from different metals. The signaling yarns are illustrated by FIG. 4A through FIG. 4C and described later.

Figure 3:
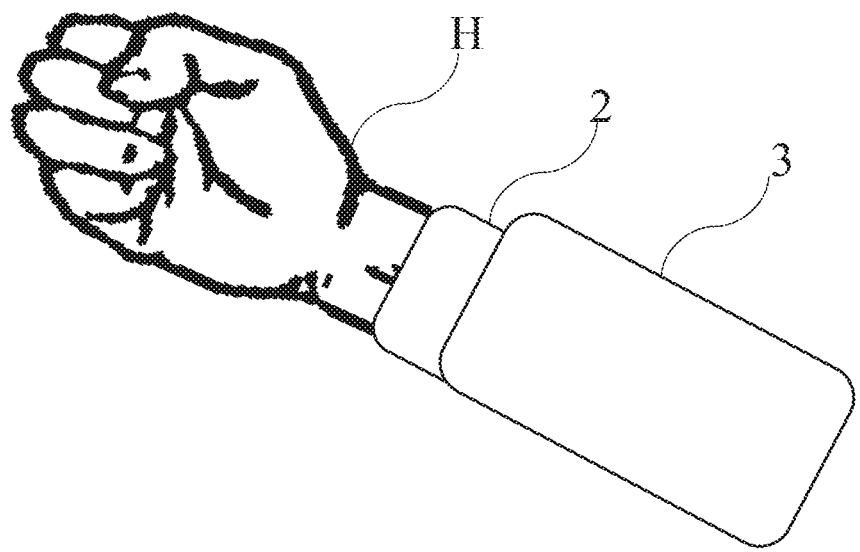
FIG. 3 is a schematic diagram showing the application of the temperature controllable textile for the wearable assembly according to an embodiment of the present disclosure.

Referring to FIG. 3, FIG. 3 is a schematic diagram showing the application of the temperature controllable textile for the wearable assembly according to an embodiment of the present disclosure. In the embodiment, the wearable assembly can be the smart clothes which have a temperature controllable textile 2 and a textile 3, wherein the textile 3 is stitched to the temperature controllable textile 2. The location of the temperature controllable textile 2 is corresponding to the location of a wrist of the hand H. The inside of the temperature controllable textile 2 (the side in contact with the wrist) can be designed to be the cooling end, and the outside of the temperature controllable textile 2 (the side not in contact with the wrist) can be designed to be the heating end, thus making the wearer feel cool in the hot environment. By contrast, the outside of the temperature controllable textile 2 (the side not in contact with the wrist) can be designed to be the cooling end, and the inside of the temperature controllable textile 2 (the side in contact with the wrist) can be designed to be the heating end, thus making the wearer feel warm in the cold environment. The way of determining the cooling end and the heating end is illustrated above. As shown in FIG. 2, whether the two junction portions act as the cooling end and the heating end, or the heating end and the cooling end, respectively, depends on Seebeck coefficients of the first conductive cloths 21, 23 and the second conductive cloths 22, and/or the polarity of the direct current power $V_{DC}$. If the positive end and the negative end of the direct current power $V_{DC}$ are changed to electrically connect to the first conductive cloths 23, 21, respectively, the cooling end and the heating end swap their positions.

Figure 4A:
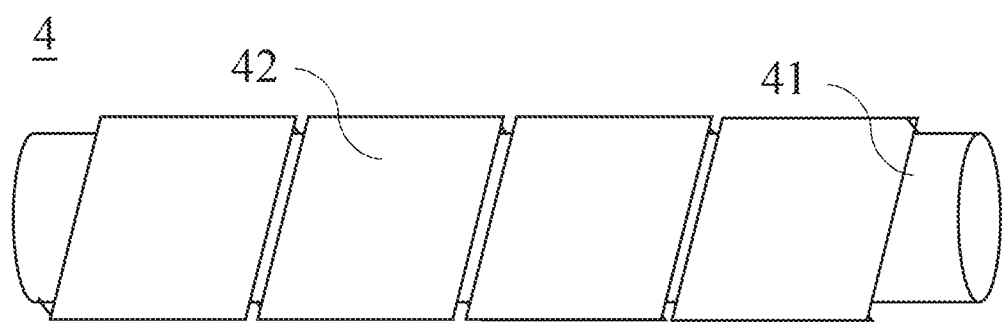
FIG. 4A is a three-dimensional diagram of a signaling yarn according to an embodiment of the present disclosure.
Figure 4B:
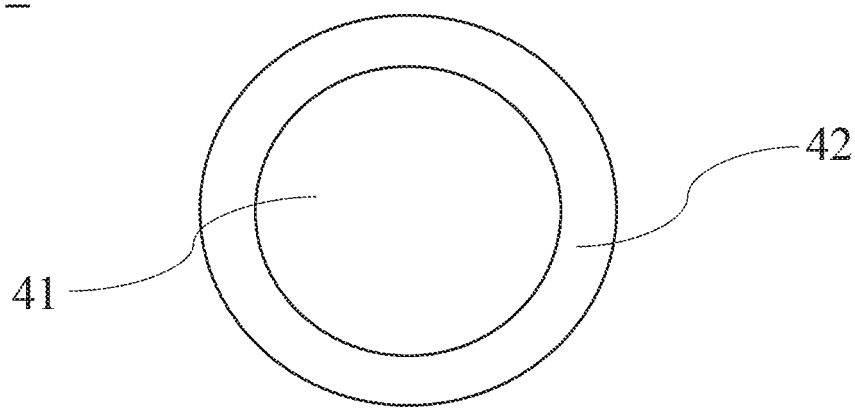
FIG. 4B is a cross sectional view of a signaling yarn according to an embodiment of the present disclosure.
Figure 4C:
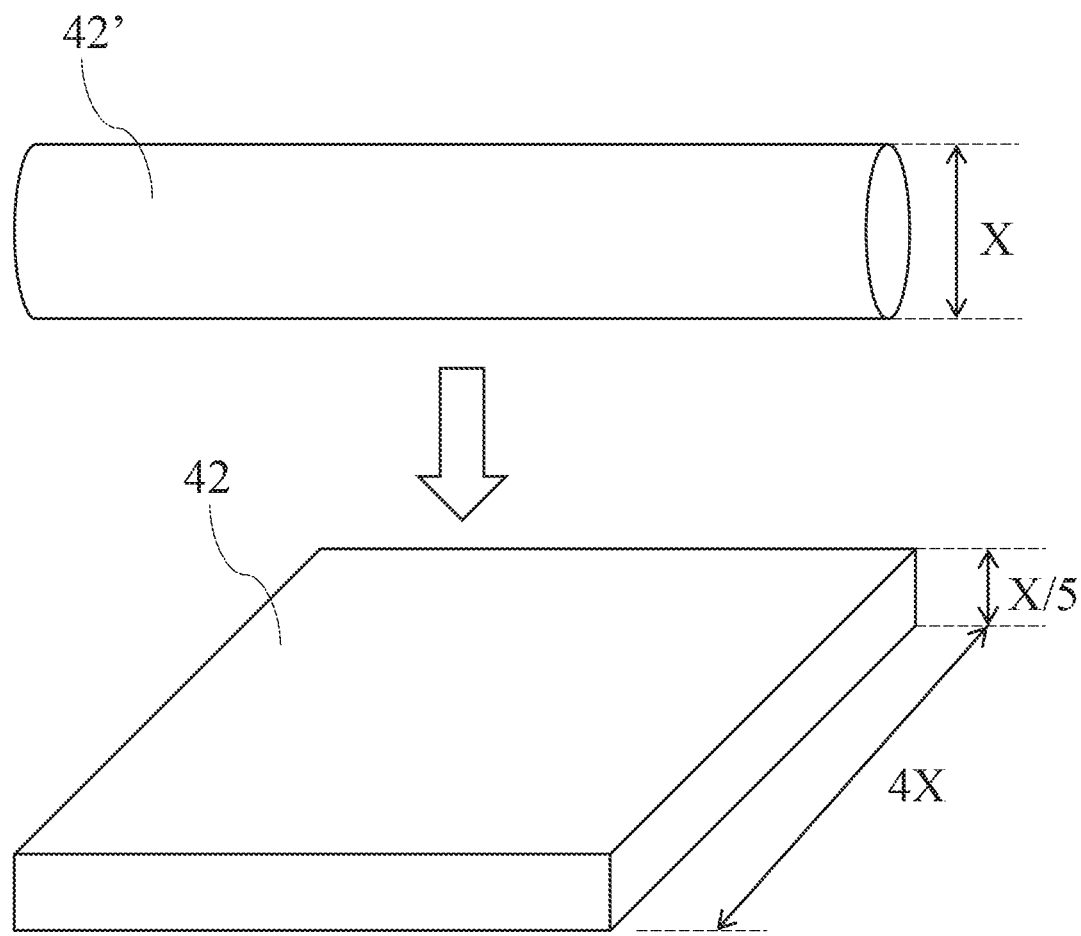
FIG. 4C is a schematic diagram showing formation of a sheet conductor of a signaling yarn according to an embodiment of the present disclosure.

Next, referring to FIG. 4A and FIG. 4B, FIG. 4A is a three-dimensional diagram of a signaling yarn according to an embodiment of the present disclosure, and FIG. 4B is a cross sectional view of a signaling yarn according to an embodiment of the present disclosure. The signaling yarn 4 comprises a staple fiber 41 and a sheet conductor 42. The staple fiber 41 acts as the supporting material to support the sheet conductor 42 which enlaces the staple fiber 41. Specifically, the sheet conductor 42 enlaces a surrounding surface of the staple fiber 41 by taking a spiral course. That the sheet conductor 42 enlaces a surrounding surface of the staple fiber 41 by taking a spiral course can increase the anti-tear strength of the signaling yarn 4.

Optionally, the anti-tear strength of the signaling yarn 4 can be further increased by selecting the strength of the staple fiber 41 and/or an aspect ratio of a cross section of the sheet conductor 42 corresponding to the spiral course. In this embodiment, the strength of the staple fiber 41 is selected to be 30 strands, and the aspect ratio of the cross section of the sheet conductor 42 corresponding to the spiral course is selected to be about 20, but the present disclosure is not limited thereto. For example, the staple fiber 41 may have the strength of 26, 28, or 40 strands, or the aspect ratio of the cross section of the sheet conductor 42 corresponding to the spiral course may be selected to be between 10 and 30.

In the embodiment, a material of the staple fiber 41 is selected from polyester, polyamides, polyacrylonitriles, polyethylenes, polypropylenes, celluloses, proteins, elastic fibers, poly perfluoroethylene, polyparaphenylene benzoxazole, polyether ketone, carbon and glass fiber, and the present disclosure is not limited thereto. The material of the short staple fiber 11 can be selected as needed. Additionally, the material of the sheet conductor 52 is the metal with electric conductivity. It is worth noting that, in FIG. 2, the metal in the signaling yarns of the first conductive cloths 21, 23 are different from the metal in the signaling yarns of the second conductive cloths 22.

Further, referring to FIG. 4C, FIG. 4C is a schematic diagram showing formation of a sheet conductor of a signaling yarn according to an embodiment of the present disclosure. In the embodiment, a length and a width of the cross section of the sheet conductor 42 are approximately 4× and X/5 respectively, wherein X is a diameter of the circular cross section of the conductive wire 42'. The conductive wire 42' is rolled by a rolling miller to form the sheet conductor 42. However, the formation of the sheet conductor 42 is not intended to limit the present disclosure. In other words, there are different implementations of the sheet conductor 42 of the embodiment of the present disclosure.

Figure 5:
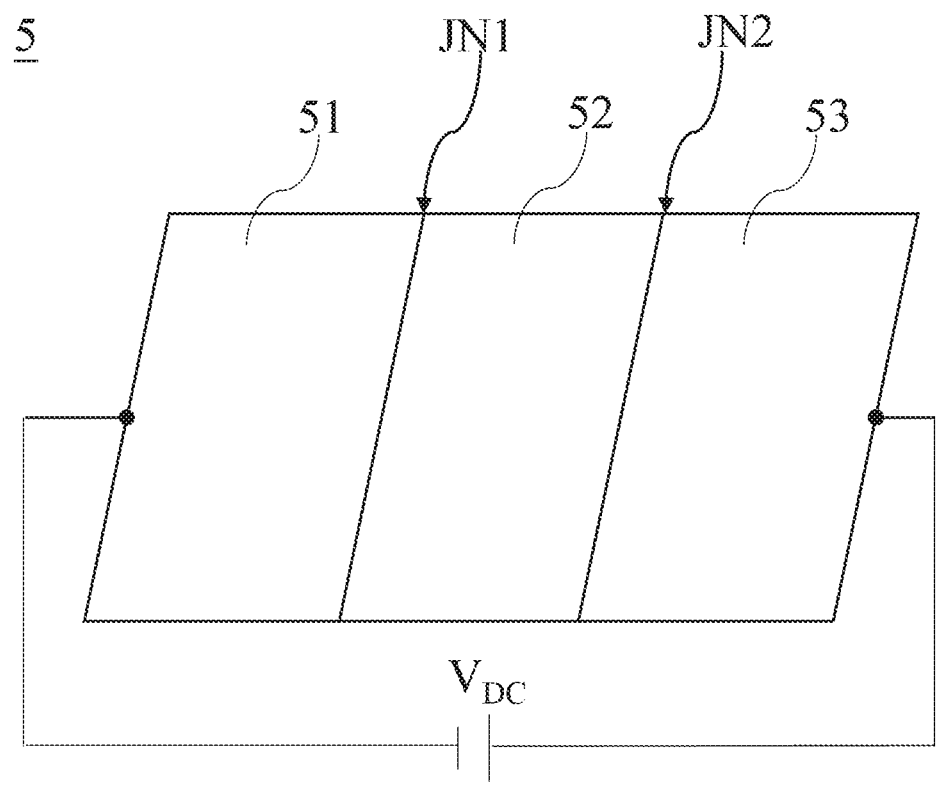
FIG. 5 is a plan view of a temperature controllable textile according to another embodiment of the present disclosure.

Further, referring to FIG. 5, FIG. 5 is a plan view of a temperature controllable textile according to another embodiment of the present disclosure. The temperature controllable textile 5 comprises two first conductive cloths 51, 53 and a second conductive cloth 52. Sides of the first conductive cloths 51, 53 are in contact with two opposite sides of the second conductive cloth 52, respectively. The first conductive cloths 51, 53 electrically connect to the second conductive cloth 52. The two sides of the first conductive cloths 51, 53 which are in contact with the second conductive cloth 52 form two junction portions JN1 and JN2 respectively. When a positive end and a negative end of the direct current power $V_{DC}$ electrically connect to the first conductive cloths 51, 53 respectively, the two junction portions JN1 and JN2 act as a cooling end and a heating end (or the heating end and the cooling end) respectively.

Being different from the embodiment of FIG. 2, the junction portions JN1 and JN2 in the temperature controllable textile 5 are lines rather than plans. When using the temperature controllable textile 5, the temperature controllable textile 5 is rolled, such that the two sides of the first conductive cloths 51, 53 which are in contact with the second conductive cloth 52, respectively, the external environment and the object (or living body) whose temperature is to be controlled. In addition, in the embodiment, the insulated heat-conductive film can be selectively disposed in the temperature controllable textile 5 as needed.

In the embodiment, the first conductive cloths 51, 53 and the second conductive cloth 52 can be formed by weaving signaling yarns, respectively, and then the first conductive cloths 51, 53 and the second conductive cloth 52 are bound to form the temperature controllable textile 5 by stitching, adhesion or the like. The metal of the signaling yarns of the first conductive cloths 51, 53 is not identical to the metal of the signaling yarns of the second conductive cloths 52. In addition, the first conductive cloths 51, 53 and the second conductive cloth 52 in the embodiment can be an integrally formed cloth which is formed by weaving a plurality of composite signaling yarns having different metals therein (to be described in detail later.)

Figure 6A:
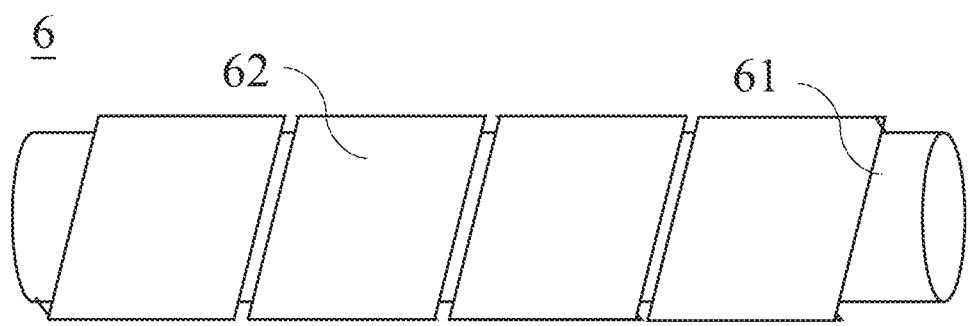
FIG. 6A is a three-dimensional diagram of a composite signaling yarn according to an embodiment of the present disclosure.
Figure 6B:
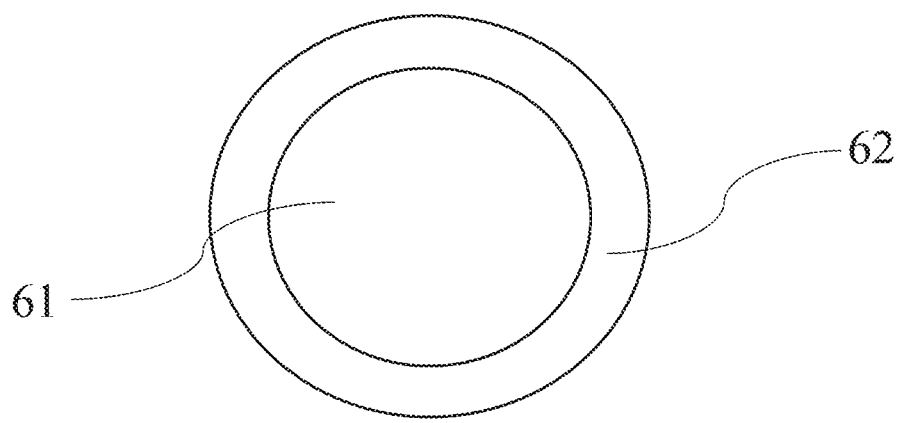
FIG. 6B is a cross sectional view of a s composite signaling yarn according to an embodiment of the present disclosure.

Referring to FIG. 6A and FIG. 6B, FIG. 6A is a three-dimensional diagram of a composite signaling yarn according to an embodiment of the present disclosure, and FIG. 6B is a cross sectional view of a s composite signaling yarn according to an embodiment of the present disclosure. The composite signaling yarn 6 comprises a staple fiber 61 and a composite sheet conductor 62, wherein the staple fiber 61 acts as a supporting material with the material and strength as mentioned above. The composite sheet conductor 62 enlaces a surrounding surface of the staple fiber 61 by taking a spiral course.

Figure 6C:
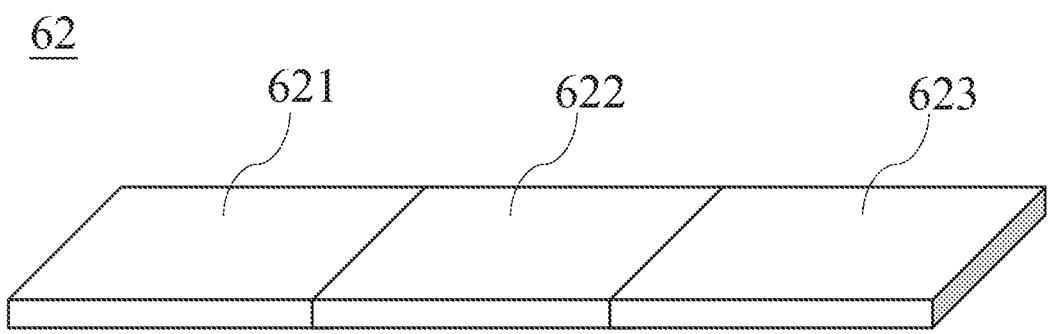
FIG. 6C is a schematic diagram showing a composite sheet conductor of a composite signaling yarn according to an embodiment of the present disclosure.

Further, the details of the composite sheet conductor are illustrated. Referring to FIG. 6C, FIG. 6C is a schematic diagram showing a composite sheet conductor of a composite signaling yarn according to an embodiment of the present disclosure. The composite sheet conductor 62 is sheet formed by connecting the sheet conductors 621 through 623 in sequence, wherein the metals of sheet conductors 621 and the 623 are the same one, but different from that of the sheet conductor 622. The locations of the sheet conductors 621 through 623 define the locations of the first conductive cloth 51, the second conductive cloth 52 and the first conductive cloth 53 in FIG. 5.

Figure 7A:
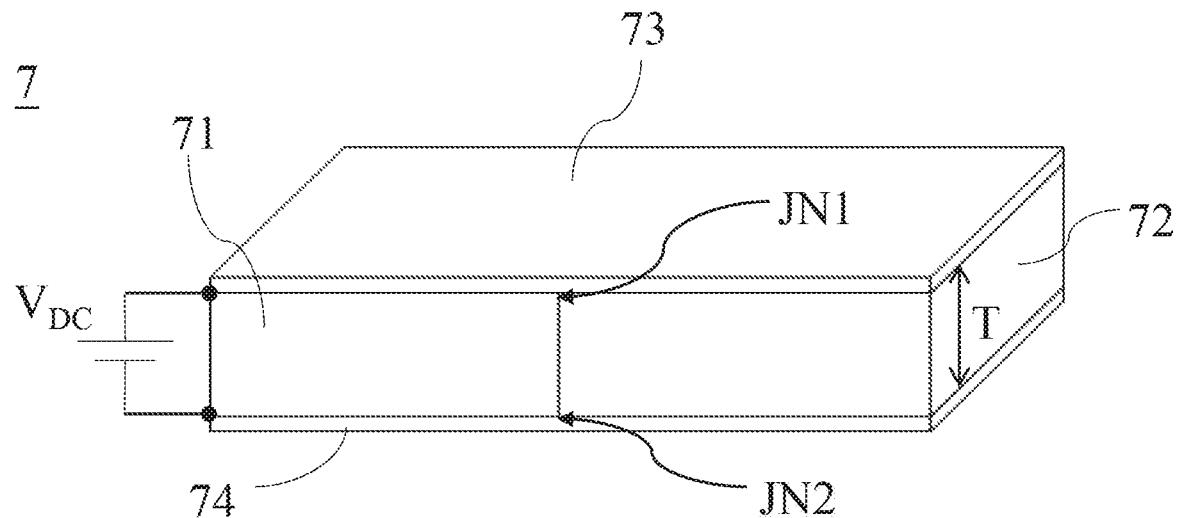
FIG. 7A is a three-dimensional diagram of a temperature controllable textile according to an embodiment of the present disclosure.
Figure 7B:
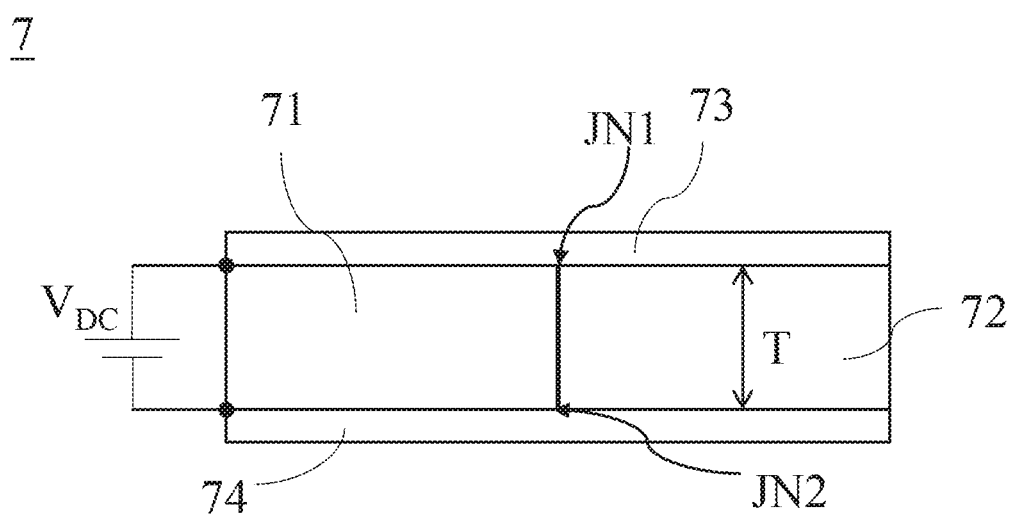
FIG. 7B is a cross sectional view of a temperature controllable textile according to an embodiment of the present disclosure.

Next, referring to FIG. 7A and FIG. 7B, FIG. 7A is a three-dimensional diagram of a temperature controllable textile according to an embodiment of the present disclosure, and FIG. 7B is a cross sectional view of a temperature controllable textile according to an embodiment of the present disclosure. The temperature controllable textile 7 comprises a first conductive cloth 71, a second conductive cloth 72 and two insulated heat-conductive films 73, 74. The metal of the first conductive cloth 71 is not the same as that of the second conductive cloth 72. The first conductive cloth 71 and the second conductive cloth 72 have a thickness T, for example, larger than or equal to 1 millimeter. The side surface of the first conductive cloth 71 is in contact with the side surface of the second conductive cloth 72, and the first conductive cloth 71 electrically connects to the second conductive cloth 72, thus forming two junction portions JN1 and JN2 on the contacting side surfaces. The insulated heat-conductive films 73, 74 respectively disposed on the top surfaces of the first conductive cloth 71 and the second conductive cloth 72 and under the bottom surfaces of the first conductive cloth 71 and the second conductive cloth 72. When a positive end and a negative end of the direct current power $V_{DC}$ electrically connects respectively with the top surface and the bottom surface of the first conductive cloth 71, the junction portions JN1 and JN2 act as a cooling end and a heating end (or the heating end and the cooling end), respectively.

Being different from the embodiment of FIG. 2, the junction portions JN1 and JN2 of the temperature controllable textile 7 are lines rather than plans. Further, being different from the embodiments of FIG. 2 and FIG. 5, the first conductive cloth 71 is in the number of one. In the embodiment, the first conductive cloth 71 and the second conductive cloth 72 are formed by weaving signaling yarns respectively, and the first conductive cloth 71 is bound to the second conductive cloth 72 to form the temperature controllable textile 7 by adhesion, stitching or the like. The metal of the signaling yarns of the first conductive cloth 71 is not the same as that of the signaling yarns of the second conductive cloth 72. In addition, the first conductive cloth 71 and the second conductive cloth 72 in the embodiment can be an integrally formed cloth formed by weaving composite signaling yarns, wherein each composite signaling yarn have different metals therein. The implementation of the composite signaling yarn is similar to the implementation of the composite signaling yarn of FIG. 6A through FIG. 6C, but the composite sheet conductor herein is merely formed by connecting two sheet conductors having different metals.

To sum up, the temperature controllable textile provided by the embodiment of the present disclosure can have a cooling end and a heating end for controlling the temperature of the object or the living body, wherein junction portions formed between the at least one first conductive cloth and the second conductive cloth of the temperature controllable textile act as the cooling end and the heating end respectively. The temperature controllable textile has the water washable and anti-tear characteristics and can be a part of the wearable assembly, thereby allowing the wearer to wash the wearable assembly smoothly and safely. Moreover, the temperature controllable textile can be in the form of the textile but is not perceived as a foreign body by the wearer, and thus wearing the wearable assembly formed from the temperature controllable textile is a satisfactory wearing experience for the wearer.

The above is only embodiments of the present disclosure, and these embodiments are not intended to limit the scope of the present disclosure.

What is claimed is:

1. A temperature controllable textile, comprising:
   two first conductive cloths, each having a first metal; and
   a second conductive cloth, having a second metal not identical to the first metal, the second conductive cloth being disposed between the two first conductive cloths, the second conductive cloth being in contact with and electrically connected to the two first conductive cloths, to form two junction portions;
   wherein, when a negative end and a positive end of a direct current power electrically connect to the two first conductive cloths, respectively, the two junction portions form a cooling end and a heating end, respectively.

2. The temperature controllable textile according to claim 1, wherein a top surface and a bottom surface of the second conductive cloth are in contact with a bottom surface of one of the first conductive cloths and a top surface of the other first conductive cloth, respectively.

3. The temperature controllable textile according to claim 1, further comprising
   two insulated heat-conductive films disposed on a top surface of one of the first conductive cloths and under a bottom surface of the other first conductive cloth, respectively, wherein the top surface of one of the first conductive cloths and the bottom surface of the other first conductive cloth are not in contact with the second conductive cloth.

4. The temperature controllable textile according to claim 2, wherein each of the two first conductive cloths and the second conductive cloth comprises a plurality of signaling yarns, and the signaling yarns each comprise:
   a staple fiber, having a strength of 26 to 40 strands, acting as a supporting material; and
   a sheet conductor, enlacing a surrounding surface of the staple fiber by taking a spiral course;
   wherein a material of the sheet conductor included in the signaling yarn of each the first conductive cloth is the first metal, and a material of the sheet conductor included in the signaling yarn of the second conductive cloth is the second metal.

5. The temperature controllable textile according to claim 1, wherein two sides of the second conductive cloth are in contact with a side of one of the first conductive cloths and a side of the other first conductive cloth, respectively.

6. The temperature controllable textile according to claim 5, wherein the two first conductive cloths and the second conductive cloth are an integrally formed cloth, wherein the integrally formed cloth comprises a plurality of composite signaling yarns, and the composite signaling yarn comprises:
   a staple fiber, having a strength of 26 to 40 strands, acting as a supporting material; and
   a composite sheet conductor, enlacing a surrounding surface of the staple fiber by taking a spiral course;
   wherein the composite sheet conductor is formed by connecting a sheet conductor of the first metal, a sheet conductor of the second metal and another sheet conductor of the first metal in sequence.

7. A temperature controllable textile, comprising:
   a first conductive cloth, having a first metal; and
   a second conductive cloth, having a second metal not identical to the first metal, wherein the first conductive cloth and the second conductive cloth have a thickness, and a side surface of the first conductive cloth is in contact with a side surface of the second conductive cloth, with the first conductive cloth electrically connecting to the second conductive cloth, to form two junction portions;

wherein, when a negative end and a positive end of a direct current power electrically connect to a top surface and a bottom surface of the first conductive cloth, respectively, the two junction portions form a cooling end and a heating end, respectively.

8. The temperature controllable textile according to claim 7, further comprising two insulated heat-conductive films, disposed on top surfaces of the first and second conductive cloths and under bottom surfaces of the first and second conductive cloths, respectively.

9. The temperature controllable textile according to claim 8, wherein the first conductive cloth and the second conductive cloth are an integrally formed cloth, wherein the integrally formed cloth comprises a plurality of composite signaling yarns, and the composite signaling yarns comprise:

a staple fiber, having a strength of 26 to 40 strands, acting as a supporting material; and a composite sheet conductor, enlacing a surrounding surface of the staple fiber by taking a spiral course;

wherein the composite sheet conductor is formed by connecting a sheet conductor of the first metal and a sheet conductor of the second metal in sequence.

10. A wearable assembly, comprising the temperature controllable textile according to claim 1.

11. A wearable assembly, comprising the temperature controllable textile according to claim 2.

12. A wearable assembly, comprising the temperature controllable textile according to claim 3.

13. A wearable assembly, comprising the temperature controllable textile according to claim 4.

14. A wearable assembly, comprising the temperature controllable textile according to claim 5.

15. A wearable assembly, comprising the temperature controllable textile according to claim 6.

16. A wearable assembly, comprising the temperature controllable textile according to claim 7.

17. A wearable assembly, comprising the temperature controllable textile according to claim 8.

18. A wearable assembly, comprising the temperature controllable textile according to claim 9.

* * * * *